(12) United States Patent
He et al.

(10) Patent No.: US 10,969,676 B2
(45) Date of Patent: Apr. 6, 2021

(54) PHOTOMASK AND EXPOSURE METHOD

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Chengyong He, Beijing (CN); Yang Wang, Beijing (CN); Jun Yang, Beijing (CN); Xin Wang, Beijing (CN); Guanzheng Li, Beijing (CN); Jinxiang Li, Beijing (CN); Xingming Wang, Beijing (CN); Peng Cai, Beijing (CN); Xiaochen Cui, Beijing (CN); Junwei Zhang, Beijing (CN); Can Zhang, Beijing (CN); Chunjie Wang, Beijing (CN)

(73) Assignees: BOE TECHNOLOGY GROUP CO., LTD., Beijing (CN); CHONGQING BOE OPTOELECTRONICS TECHNOLOGY CO.,LTD., Chongqing (CN)

( * ) Notice: Subject to any disclaimer, the term of this patent is extended or adjusted under 35 U.S.C. 154(b) by 238 days.

(21) Appl. No.: 16/106,181

(22) Filed: Aug. 21, 2018

(65) Prior Publication Data
US 2019/0204729 A1 Jul. 4, 2019

(30) Foreign Application Priority Data
Jan. 2, 2018 (CN) .......................... 201810001473.1

(51) Int. Cl.
*G03F 1/50* (2012.01)
*G03F 7/20* (2006.01)
*H01L 27/12* (2006.01)

(52) U.S. Cl.
CPC .............. *G03F 1/50* (2013.01); *G03F 7/2002* (2013.01); *G03F 7/70283* (2013.01); *H01L 27/1288* (2013.01)

(58) Field of Classification Search
CPC ................................ G03F 1/50; G03F 7/70283
See application file for complete search history.

(56) References Cited

U.S. PATENT DOCUMENTS

2012/0013880 A1* 1/2012 Choi ................... G03F 7/70275
355/67
2016/0049278 A1 2/2016 Wang et al.

FOREIGN PATENT DOCUMENTS

| CN | 105372944 A | 3/2016 |
|---|---|---|
| JP | 2006332197 A | 12/2006 |

OTHER PUBLICATIONS

First Office Action for Chinese Application No. 201810001473.1, dated Jul. 29, 2019, 8 Pages.

* cited by examiner

*Primary Examiner* — Daborah Chacko-Davis
(74) *Attorney, Agent, or Firm* — Brooks Kushman P.C.

(57) ABSTRACT

A photomask and an exposure method are provided. The photomask includes a photomask body including a first surface and a second surface opposite to each other; and a first light-transmissive region penetrating through the first surface and the second surface, wherein a light adjustment component is in the first light-transmissive region and configured to converge a first light beam incident onto the first surface to a second light beam emergent from the second surface, and a cross-sectional area of the first light beam sectioned by the first surface is larger than that of the second light beam sectioned by the second surface.

9 Claims, 4 Drawing Sheets

PHOTOMASK AND EXPOSURE METHOD

CROSS-REFERENCE TO RELATED APPLICATION

This application claims priority to Chinese Patent Application No. 201810001473.1 filed Jan. 2, 2018, which is incorporated herein by reference in its entirety.

TECHNICAL FIELD

The present disclosure relates to the field of exposure technology, and particularly relates to a photomask and an exposure method.

BACKGROUND

A photolithographic process is an important process for forming a thin-film-transistor (TFT) array substrate, and a photomask is an important tool used in the photolithographic process. The photomask may be a common photomask or a half-exposure photomask.

SUMMARY

The present disclosure provides a photomask and an exposure method.

In a first aspect, the present disclosure provides photomask. The photomask includes: a photomask body including a first surface and a second surface opposite to each other; and a first light-transmissive region penetrating through the first surface and the second surface; wherein a light adjustment component is in the first light-transmissive region and configured to converge a first light beam incident from one side of the photomask body at which the first surface is located to a second light beam emergent from the other side of the photomask body at which the second surface is located, and a cross-sectional area of the first light beam sectioned by the first surface is larger than that of the second light beam sectioned by the second surface.

Optionally, the first light-transmissive region includes a first light-transmissive subregion in the first surface and a second light-transmissive subregion in the second surface, and an area of the first light-transmissive subregion is larger than that of the second light-transmissive subregion.

Optionally, the light adjustment component includes a first light convergence structure in the first light-transmissive subregion, and a second light convergence structure or a light divergence structure in the second light-transmissive subregion.

Optionally, the first light convergence structure and the second light convergence structure are convex lenses, the light adjustment component includes a first convex lens in the first light-transmissive subregion and a second convex lens in the second light-transmissive subregion, an optic axis of the first convex lens and an optic axis of the second convex lens coincide with each other, and a focal distance of the first convex lens is larger than that of the second convex lens, a first focal point of the first convex lens close to the second convex lens and a second focal point of the second convex lens close to the first convex lens coincide with each other.

Optionally, the first convex lens and the photomask body are integrated, and the optic axis of the first convex lens is perpendicular to the first surface; and the second convex lens and the photomask body are integrated, and the optic axis of the second convex lens is perpendicular to the second surface.

Optionally, the photomask body includes a first body portion and a second body portion split from each other, the first surface is on the first body portion and the first convex lens is integrated with the first body portion, and the optic axis of the first convex lens is perpendicular to the first surface; the second surface is on the second body portion, the second convex lens is integrated with the second body portion, and the optic axis of the second convex lens is perpendicular to the second surface.

Optionally, the first light convergence structure is a convex lens and the second light divergence structure is a concave lens, the light adjustment component includes a first convex lens in the first light-transmissive subregion and the concave lens in the second light-transmissive subregion, an optic axis of the first convex lens and an optic axis of the concave lens coincide with each other, and a third focal point of the first convex lens close to the concave lens and a fourth focal point of the concave lens away from the first convex lens coincide with each other.

Optionally, the first convex lens and the photomask body are integrated, and the optic axis of the first convex lens is perpendicular to the first surface; the concave lens and the photomask body are integrated, and the optic axis of the concave lens is perpendicular to the second surface.

Optionally, the photomask body includes a first body portion and a second body portion split from each other, the first surface is on the first body portion and the first convex lens is integrated with the first body portion, and the optic axis of the first convex lens is perpendicular to the first surface; the second surface is on the second body portion, the concave lens is integrated with the second body portion, and the optic axis of the concave lens is perpendicular to the second surface.

Optionally, the photomask body is formed of light transmissible materials, and regions of the photomask body other than the first light-transmissive region are provided with a light shielding layer.

Optionally, the photomask body is formed of quartz or glass, and the light shielding layer is formed of chromium oxide.

Optionally, a first light shielding layer is on regions of the first surface of the photomask body other than the first light-transmissive subregion, and a second light shielding layer is on regions of the second surface of the photomask body other than the second light-transmissive subregion.

Optionally, the photomask further includes: a second light-transmissive region penetrating through the first surface and the second surface, wherein the second light-transmissive region includes a third light-transmissive subregion in the first surface and a fourth light-transmissive subregion in the second surface, the third light-transmissive subregion and the fourth light-transmissive subregion is opposite to each other and have a same area, so that a third collimated light beam incident from the one side of the photomask body at which the first surface is located has a same width as that of a four collimated light beam emergent from the other side of the photomask body at which the second surface is located.

Optionally, a third light shielding layer is on regions of the first surface of the photomask body other than the first light-transmissive subregion and the third light-transmissive subregion, and a fourth light shielding layer is on regions of the second surface of the photomask body other than the second light-transmissive subregion and the fourth light-transmissive subregion.

In a second aspect, the present disclosure provides an exposure method. The method includes performing exposure by using the photomask according to the first aspect.

DETAILED DESCRIPTION

Figure 1:
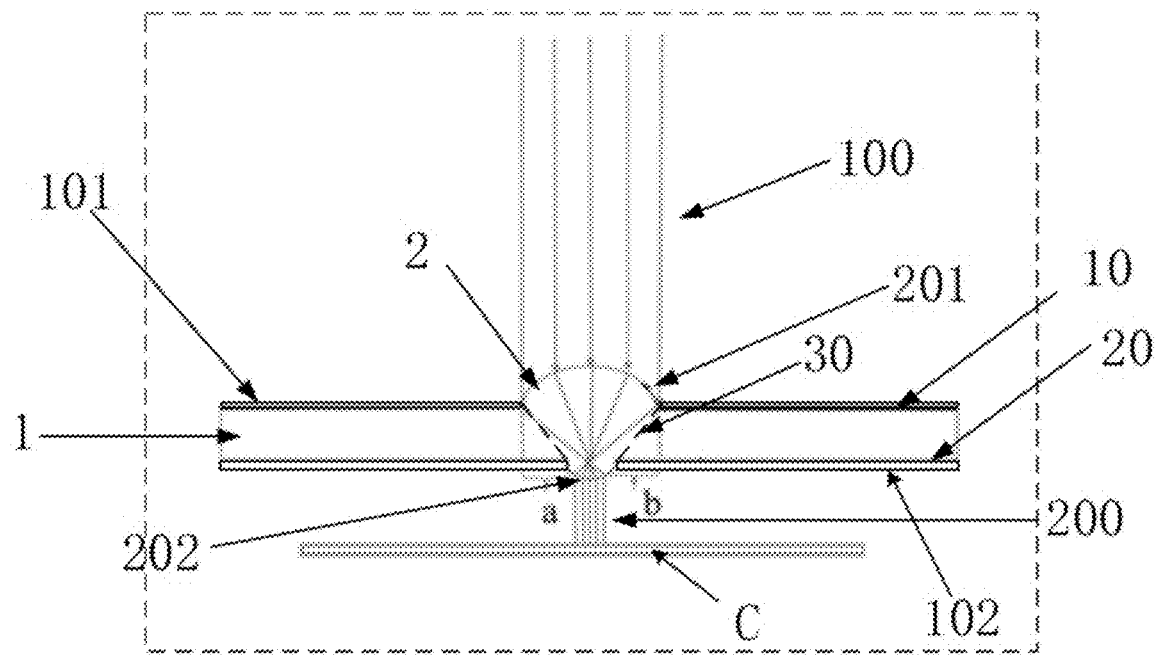
FIG. 1 is a first structural schematic diagram of a photomask according to some embodiments of the present disclosure.

Features and principles of the present disclosure will be described in detail hereinafter in combination with accompanying figures. Embodiments of the present disclosure only serve to explain the present disclosure, but do not limit the protection scope of the present disclosure.

FIGS. 1-4 are structural schematic diagrams of a photomask according to some embodiments of the present disclosure.

As shown in FIGS. 1-4, the present disclosure provides a photomask. The photomask includes a photomask body 1. The photomask body 1 includes a first surface 10 and a second surface 20 opposite to each other; and a first light-transmissive region 30 penetrating through the first surface 10 and the second surface 20, wherein a light adjustment component 2 is arranged in the first light-transmissive region 30 and configured to converge a first light beam 100 incident from one side of the photomask at which the first surface 10 is located, to a second light beam 200 emergent from the other side of the photomask at which the second surface 20 is located, and a cross-sectional area of the first light beam 100 sectioned by the first surface 10 is larger than that of the second light beam 200 sectioned by the second surface 20.

The light adjustment component 2 is configured to converge the first light beam 100 incident onto the first surface 10 of the photomask to the second light beam 200 emergent from the second surface 20. A width of the second light beam 200 is smaller than that of the first light beam 100. Thus, an amount of light transmitted through the first light-transmissive region 30 may be increased, a utilization rate of light may be increased, and an exposure time may be decreased when performing an exposure process, and an efficiency of the exposure is increased. The first light beam 100 is incident onto the first surface 10 perpendicularly, and the second light beam 200 is emergent from the second surface 20 perpendicularly. In such a way, an area of the second light beam incident onto a substrate C may be controlled and a quality of the exposure may be ensured.

It is noted that, in order to more precisely control the area of the second light beam 200 incident onto the substrate C, each of the first light beam and the second light beam may be a collimated light beam, and the width of the first light beam 100 is larger than that of the second light beam 200.

The first light-transmissive region 30 includes a first light-transmissive subregion 31 in the first surface 10 and a second light-transmissive subregion 32 in the second surface 20, and an area of the first light-transmissive subregion 31 is larger than that of the second light-transmissive subregion 32.

As shown in FIG. 1, a region "a" and a region "b" in FIG. 1 are regions by which the first light-transmissive subregion 31 extends beyond the second light-transmissive subregion 32. As compared with a photomask in the related art having a same light-incident region (i.e., a same first light-transmissive region) as the photomask of the present disclosure, i.e., having a same first light-transmissive subregion 31 on the first surface 10, the light adjustment component 2 of the present disclosure converges the first light beam 100 incident onto the first surface 10 of the photomask to the second light beam 200 emergent from the second surface 20, and the area of the second light-transmissive subregion 32 is smaller than that of the first light-transmissive subregion 31. That is, the light beam incident into the first light-transmissive subregion 31 is all emergent from the second light-transmissive subregion 32, and thus the width of the light beam is decreased.

When manufacturing electrical circuits in an array substrate by using the photomask of the present disclosure, a line width of a metal line may be reduced, and accordingly, a region of the array substrate through which light may be transmitted is increased, and an aperture ratio (the aperture ratio refers to a ratio between an area of a light-transmitted region other than a wiring portion and a transistor portion (generally hidden by a black matrix) of a pixel and an entirety of an area of the pixel; the higher the aperture ratio is, the higher an efficiency of light transmission is) is enhanced.

The light adjustment component 2 may have a plurality of kinds of structures, as long as the structures may converge the first light beam 100 incident onto the first surface 10 to the second light beam 200 emergent from the second surface 20. For example, the light adjustment component may include a first light convergence structure in the first light-transmissive subregion 31, and a second light convergence structure or a light divergence structure in the second light-transmissive subregion 32. Several specific structures of the light adjustment component of the present disclosure will be described hereinafter, and the structures of the light adjustment component of the present disclosure are not limited thereto.

A first example: as shown in FIG. 1, the first light convergence structure and the second light convergence structure are convex lenses, the light adjustment component 2 includes a first convex lens 201 in the first light-transmissive subregion 31 and a second convex lens 202 in the second light-transmissive subregion 32, an optic axis of the first convex lens 201 and an optic axis of the second convex lens 202 coincide with each other, and a focal distance of the first convex lens 201 is larger than that of the second convex lens 202, a first focal point of the first convex lens 201 close to the second convex lens 202 and a second focal point of the second convex lens 202 close to the first convex lens 201 coincide with each other.

The width of the first light beam 100 is reduced by using the imaging principle of a convex lens, and the first light beam 100 is converged to the second light beam 200.

Optionally, the first convex lens 201 and the photomask body 1 are integrated, a center of the first convex 201 is in a plane in which the first surface 10 is located (as shown in FIG. 1, the center of the first convex lens 201 is a center of a light-emergent surface of the first convex lens 201, i.e., the light-emergent surface of the first convex lens 201 and the first surface 10 are in a same plane), and the optic axis of the first convex lens 201 is perpendicular to the first surface 10.

The second convex lens 202 and the photomask body 1 are integrated, a center of the second convex 202 is in a plane in which the second surface 20 is located (the center of the second convex lens 202 is a center of a light-incident surface of the second convex lens 202, i.e., the light-incident surface of the second convex lens 202 and the second surface 20 are in a same plane), and the optic axis of the second convex lens 202 is perpendicular to the second surface 20.

In order to ensure that the light beam transmitted through the light adjustment component 2 is perpendicular to the second surface 20, i.e. that the second light beam 200 is perpendicular to the second surface, the focal distances of the first convex lens 201 and the second convex lens 202 may be determined by the focal distance formula of a lens, $1/F=(N-1)(1/R1+1/R2)$, wherein F is a focal distance, N is a refractive index of a lens, R1 and R2 are radiuses of curvature of two surfaces (a light-incident surface and a light-emergent surface) of the first convex lens 201 or the second convex lens 202, a radius of curvature of one surface convex outwardly in an arc direction has a positive value, and a radius of curvature of one surface concave inwardly in an arc direction has a negative value (i.e. if a surface of a lens is a convex surface, then the radius of curvature of this convex surface is a positive value; and if a surface of a lens is a concave surface, then the radius of curvature of this concave surface is a negative value), and a radius of curvature of a plane is infinity. When values of any two of F, N or R are determined, a value of the remaining one of F, N or R may be calculated.

In the light convergence structure of this example, the light-incident surface of the first convex lens 201 is a convex surface, and the light-emergent surface of the first convex lens 201 is a plane. The focal distance of the first convex lens 201 equals to the radius of curvature of the light-incident surface of the first convex lens 201, i.e., F=R1, N is a refractive index of the first convex lens 201, 1/R2=0 (the light-emergent surface of the first convex lens 201 is a plane, and R2 is infinity). Therefore, R1=F, i.e., the focal distance F is determined by the radius of curvature of the light-incident surface of the first convex lens 201. The light-incident surface of the second convex lens 202 is a plane, and the light-emergent surface of the second convex lens 202 is a convex plane. Similar to the first convex lens 201, the focal distance of the second convex lens 202 is determined by the radius of curvature of the light-emergent surface of the second convex lens 202.

A size of a light spot illuminated on the substrate C, i.e., the width of the second light beam 200, may be determined by a focal distance of a convex lens. Therefore, the focal distance F may be selected according to actual requirements. Specifically, the radiuses of curvature of the first convex lens 201 or the second convex lens 202 may be determined by the selected focal distance F and may be calculated by the above focal distance formula of a lens, so that the second light beam emergent from the second surface is a collimated light beam.

Figure 2:
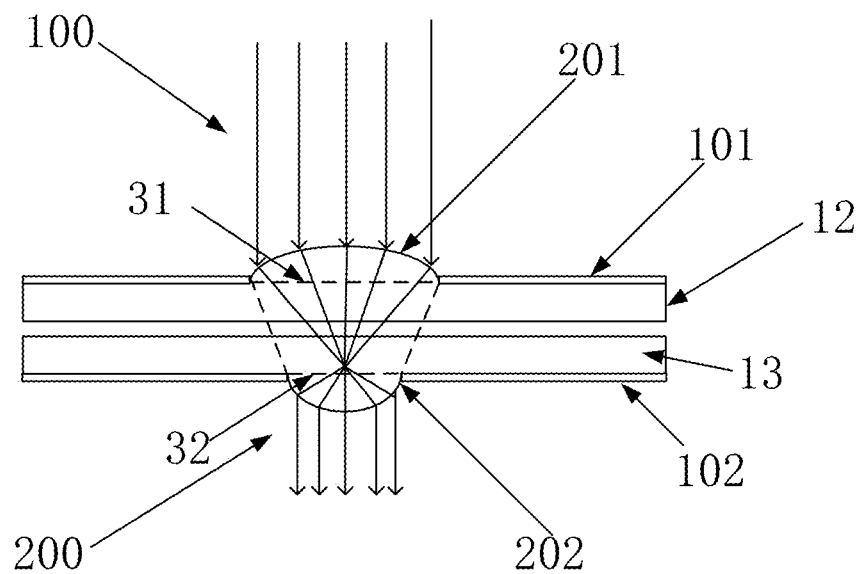
FIG. 2 is a second structural schematic diagram of a photomask according to some embodiments of the present disclosure.

A second example: as shown in FIG. 2, the photomask body 1 includes a first body portion 12 and a second body portion 13 split from each other, the first surface 10 is on the first body portion 12 and the first convex lens 201 is integrated with the first body portion 12, and the optic axis of the first convex lens 201 is perpendicular to the first surface 10. The second surface 20 is on the second body portion 13, the second convex lens 202 is integrated with the second body portion 13, and the optic axis of the second convex lens 202 is perpendicular to the second surface 20.

In this example, a principle that the first light beam 100 is converged to the second light beam 200 is the same as that in the first example. In actual applications, the first body portion 12 and the second body portion 13 are in contact with each other closely, the optic axis of the first convex lens 201 and the optic axis of the second convex lens 202 coincide with each other, and the first focal point of the first convex lens 201 close to the second convex lens 202 and the second focal point of the second convex lens 202 close to the first convex lens 201 coincide with each other. If one of the first convex lens 201 and the second convex lens 202 is damaged, then only the damaged one of the first convex lens 201 or the second convex lens 201 needs to be replaced, without needing to replace an entirety of the photomask. That is, only one of the first body portion 12 or the second body portion 13 corresponding to the damaged one is replaced, and such replacement is convenient and fast.

In order to ensure that the first light beam 100 is converged to the second light beam 200, i.e., in order to ensure that the second light beam 200 is perpendicular to the second surface 20, the photomask body needs to have a certain thickness, to ensure that the first focal point of the first convex lens 201 close to the second convex lens 202 and the second focal point of the second convex lens 202 close to the first convex lens 201 coincide with each other. In this example, a predetermined distance may be set between the first body portion 12 and the second body portion 13 split from each other in an actual application, so that the first focal point of the first convex lens 201 close to the second convex lens 202 and the second focal point of the second convex lens 202 close to the first convex lens 201 coincide with each other, and the photomask may be thinned and a cost may be reduced.

In this example, both the light-incident surface and the light-emergent surface of the first convex lens 201 may be convex surfaces, and both the light-incident surface and the light-emergent surface of the second convex lens 201 may be convex surfaces, as long as the first convex lens 201 and the second convex lens 201 may cooperate to converge the first light beam 100 to the second light beam 200.

Figure 3:
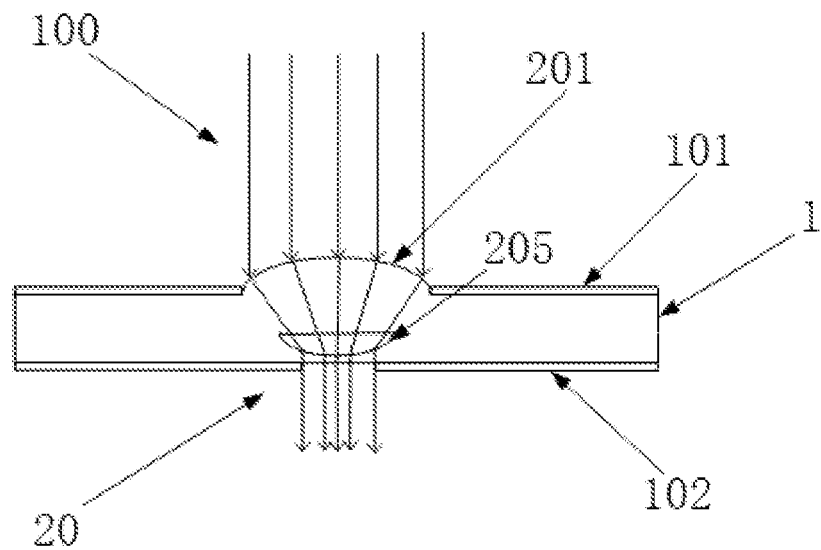
FIG. 3 is a third structural schematic diagram of a photomask according to some embodiments of the present disclosure.

A third example: as shown in FIG. 3, the light convergence structure is a convex lens and the light divergence structure is a concave lens. The light adjustment component 2 includes a first convex lens 201 in the first light-transmissive subregion 31 and a concave lens 205 in the second light-transmissive subregion 32, an optic axis of the first convex lens 201 and an optic axis of the concave lens 205 coincide with each other, and a third focal point of the first convex lens 201 close to the concave lens 205 and a fourth focal point of the concave lens 205 away from the first convex lens 201 coincide with each other.

Optionally, the first convex lens 201 and the photomask body 1 are integrated, a light-emergent surface of the first convex lens 201 is in a plane in which the first surface 10 is located, and an optic axis of the first convex lens 201 is perpendicular to the first surface 20; the concave lens 205 and the photomask body 1 are integrated, a light-emergent surface of the concave lens 205 is in a plane in which the second surface 20 is located, and an optic axis of the concave lens 205 is perpendicular to the second surface 20.

In the example, a light-incident surface of the first convex lens 201 is a convex surface, and a light-emergent surface of the first convex lens 201 is a plane; a light-incident surface of the concave lens 205 is a concave surface, and the light-emergent surface of the concave lens 205 is a plane.

Figure 4:
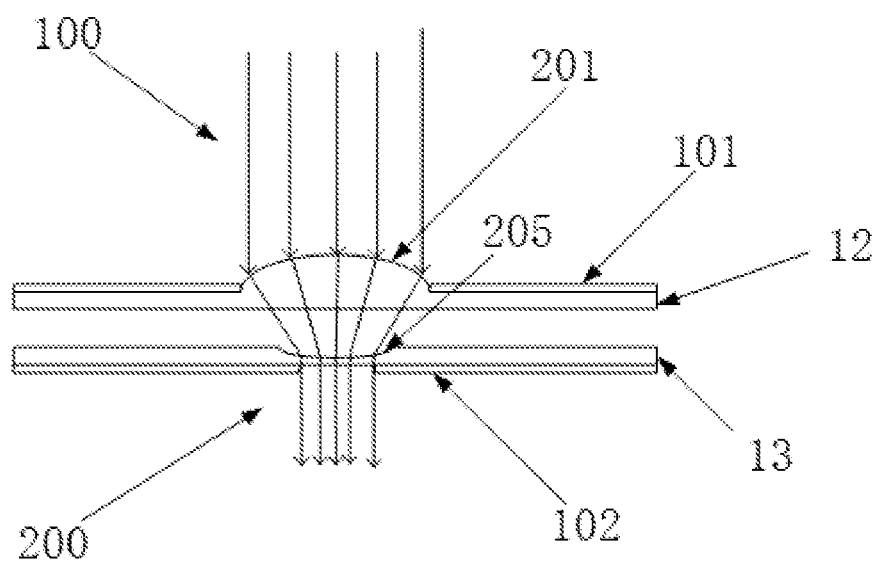
FIG. 4 is a fourth structural schematic diagram of a photomask according to some embodiments of the present disclosure.
Figure 5:
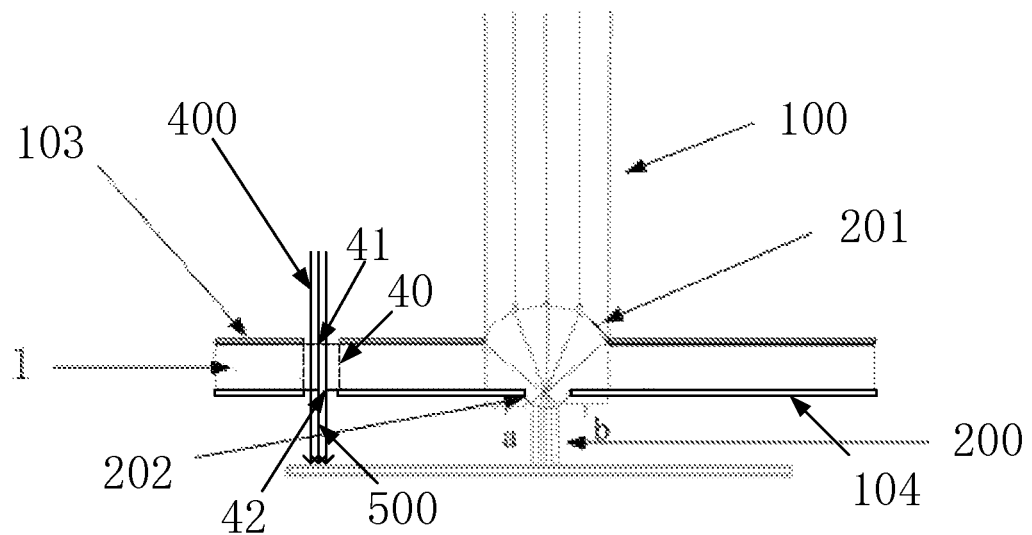
FIG. 5 is a fifth structural schematic diagram of a photomask according to some embodiments of the present disclosure.
Figure 6:
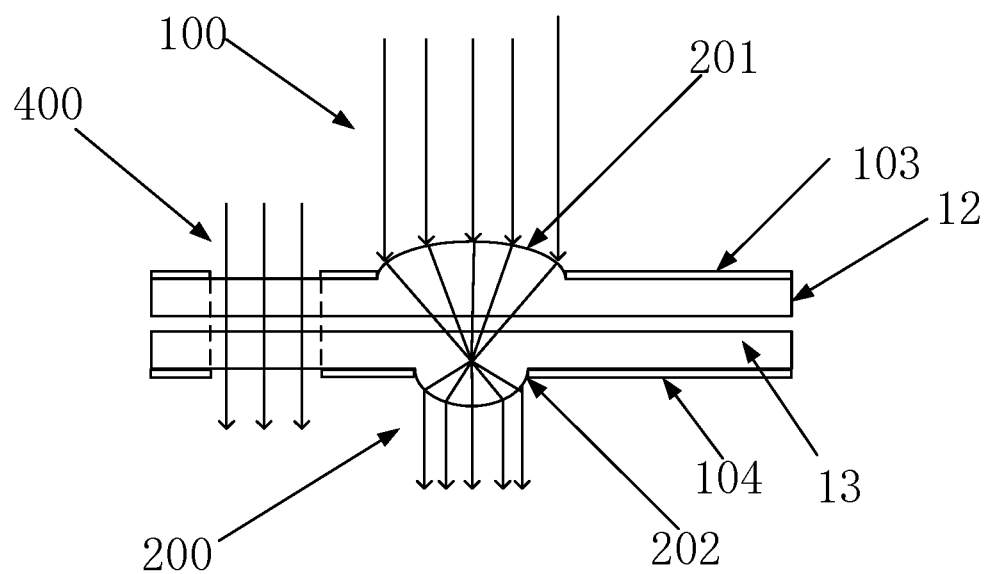
FIG. 6 is a sixth structural schematic diagram of a photomask according to some embodiments of the present disclosure.
Figure 7:
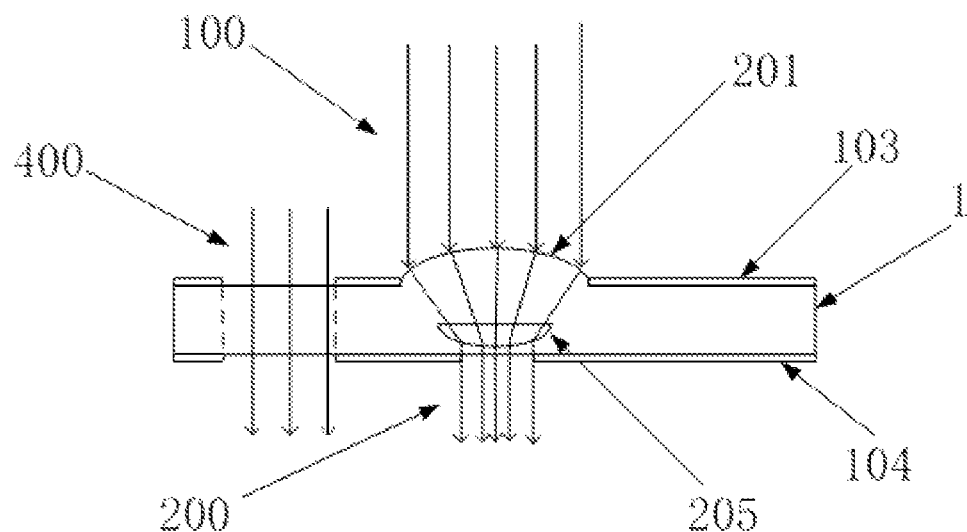
FIG. 7 is a seventh structural schematic diagram of a photomask according to some embodiments of the present disclosure.
Figure 8:
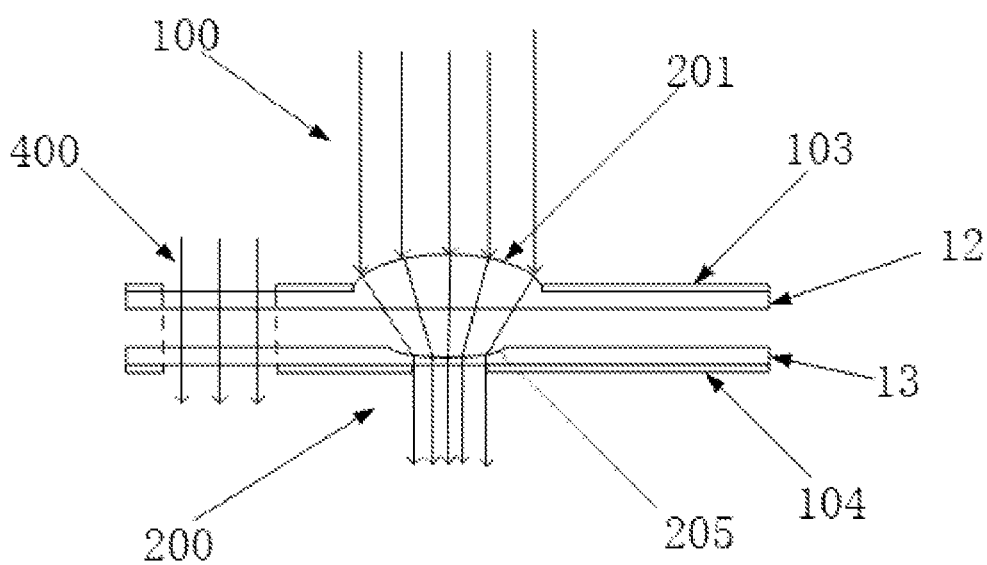
FIG. 8 is an eighth structural schematic diagram of a photomask according to some embodiments of the present disclosure.

A fourth example: as shown in FIG. 4, the photomask body 1 includes a first body portion 12 and a second body portion 13 split from each other, the first surface 10 is on the first body portion 12 and the first convex lens 201 is integrated with the first body portion 12, and the optic axis of the first convex lens 201 is perpendicular to the first surface 10; the second surface 20 is on the second body portion 13, the concave lens 205 is integrated with the second body portion 13, and the optic axis of the concave lens 205 is perpendicular to the second surface 20.

In this example, both the light-incident surface and the light-emergent surface of the first convex lens 201 may be convex surfaces; the light-incident surface of the concave lens 205 may be a concave surface and the light-emergent surface of the concave lens 205 may be a convex surface or a plane, as long as the first convex lens 201 and the concave lens 205 may cooperate to converge the first light beam 100 to the second light beam 200.

In the third and the fourth examples, a convex lens and a concave lens are combined to converge the first light beam to the second light beam. The concave surface of the concave lens faces towards the first convex lens, and the thickness of the photomask body 1 of the photomask is generally small. When the first convex lens 201 and the concave lens 205 are integrated with the photomask body 1 in the third example, the photomask in the third example might be difficult to be manufactured. In the examples of combining the convex lens with the concave lens to converge the first light beam to the second light beam, optionally, the photomask having a structure shown in the fourth example may be used so as to lower difficulty of manufacturing the photomask.

In the present disclosure, the photomask body 1 is formed of light transmissible materials, and regions of the photomask body 1 other than the first light-transmissive region 30 are provided with a light shielding layer 101.

Since an entirety of the photomask body 1 is formed of light transmissible materials, regions of the first surface other than the first light-transmissive region are provided with the light shielding layer so as to ensure no light transmits through the regions other than the first light-transmissive region 30. Optionally, a second light shielding layer 102 may also be formed on regions of the second surface other than the second light-transmissive subregion.

Specifically, the photomask body may be formed of quartz or glass, and the first light shielding layer 101 and the second light shielding layer 102 may be formed of chrome oxide, but the present disclosure is not limited thereto.

It may be understood that, although only one first light-transmissive region 30 is shown in FIGS. 1-4, a plurality of first light-transmissive regions 30 may be arranged in the photomask body 1 according to actual requirements of exposure, and shapes and sizes of the first light-transmissive regions 30 may be configured according to actual needs. Therefore, variations of FIGS. 1-4 also fall within the scope of the present disclosure.

FIGS. 5-8 are other structural schematic diagrams of a photomask of the present disclosure. In the photomask shown in FIGS. 5-8, as compared with the photomask shown in FIGS. 1-4, the photomask further includes a second light-transmissive region 40 penetrating through the first surface 10 and the second surface 20, wherein the second light-transmissive region 40 includes a third light-transmissive subregion 41 in the first surface 10 and a fourth light-transmissive subregion 42 in the second surface 20, the third light-transmissive subregion 41 and the fourth light-transmissive subregion 42 is opposite to each other and have a same area, so that a third collimated light beam 400 incident from the side of the photomask at which the first surface 10 is located has a same width as that of a four collimated light beam 500 emergent from the side of the photomask at which the second surface 20 is located.

When a photolithography process is performed by using a photomask having the first light-transmissive region 30 and the second light-transmissive region 40 and when the second light-transmissive subregion 32 has a same area as that of the fourth light-transmissive subregion 42, a light intensity of the second light beam 200 transmitted through the first light-transmissive region 30 under a first UV illumination is higher than that of the fourth light beam 500 transmitted through the second light-transmissive region 40 under a same first UV illumination. Therefore, by using a same photomask, different exposure degrees may be achieved.

The photomask is formed of light transmissible materials, and regions of the photomask body 1 other than the first light-transmissive region 30 and the second light-transmissive region 40 are provided with a light shielding layer. Specifically, a third light shielding layer 103 is arranged on regions of the first surface 30 other than the first light-transmissive subregion 31 and the third light-transmissive subregion 41.

Optionally, a fourth light shielding layer 104 is arranged on regions of the second surface 20 other than the second light-transmissive subregion 32 and the fourth light-transmissive subregion 42, so as to ensure accuracies of regions within which light beams emitted from the photomask are.

Optionally, in the present disclosure, the photomask body may be formed of quartz or glass, and the third light shielding layer 103 and the fourth light shielding layer 104 may be formed of chrome oxide, but the present disclosure is not limited thereto.

It may be understood that, although only one first light-transmissive region 30 and only one second light-transmissive region 40 are shown in FIGS. 5-8, a plurality of first light-transmissive regions 30 or a plurality of second light-transmissive region 40 may be arranged in the photomask body 1 according to actual requirements of exposure, and shapes and sizes of the first light-transmissive regions 30 or the second light-transmissive regions 40 may be configured according to actual needs. Therefore, variations of FIGS. 5-8 also fall within the scope of the present disclosure.

An illumination quantity of light transmitting through the photomask may be increased by using the photomask of the present disclosure having the light adjustment component 2. An exposure may be finished with a lower illumination quantity of light or a shorter illumination duration of light, and an exposure time is shortened, a lifetime of a UV light is extended, and a cost is reduced.

The photomask of the present disclosure may be used in the photolithography process, or may be used in an optical alignment process. In the optical alignment process, UV (ultraviolet) light is illuminated on a polyimide film, chains in the polyimide are decomposed by the UV light, and the optical alignment process is finished. The photomask of the present disclosure may enhance a utilization rate of light, effectively reduce a line width, enhance a rate of the optical alignment process, and reduce the cost. Of course, the photomask of the present disclosure may also be used in other processes, and detailed description thereof is not provided herein.

The present disclosure also provides an exposure method. The method includes performing exposure to a substrate or a film by using the above photomask.

The light adjustment component of the present disclosure converges the first light beam incident on the first surface to the second light beam emergent from the second surface, and the cross-sectional area of the first light beam sectioned by the first surface is larger than that of the second light beam sectioned by the second surface; the illumination quantity of light transmitted through the first light-transmissive region is increased and the utilization rate of light is increased.

The above described embodiments of the present disclosure are optional embodiments. It should be noted that numerous modifications and embellishments may be made by one of ordinary skills in the art without departing from the spirit of the present disclosure, and such modifications and embellishments also fall within the scope of the present disclosure.

What is claimed is:

1. A photomask, comprising:
   a photomask body, comprising a first surface and a second surface opposite to each other; and
   a first light-transmissive region penetrating through the first surface and the second surface;
   wherein a light adjustment component is in the first light-transmissive region and configured to converge a first light beam incident from one side of the photomask body at which the first surface is located to a second light beam emergent from the other side of the photomask body at which the second surface is located, and a cross-sectional area of the first light beam sectioned by the first surface is larger than that of the second light beam sectioned by the second surface;
   wherein the first light-transmissive region comprises a first light-transmissive subregion in the first surface and a second light-transmissive subregion in the second surface, and an area of the first light-transmissive subregion is larger than that of the second light-transmissive subregion;
   wherein the light adjustment component comprises a first light convergence structure in the first light-transmissive subregion, and a second light convergence structure or a light divergence structure in the second light-transmissive subregion;
   wherein the first light convergence structure is a convex lens and the second light divergence structure is a concave lens, the light adjustment component comprises a first convex lens in the first light-transmissive subregion and the concave lens in the second light-transmissive subregion, an optic axis of the first convex lens and an optic axis of the concave lens coincide with each other, and a third focal point of the first convex lens close to the concave lens and a fourth focal point of the concave lens away from the first convex lens coincide with each other.

2. The photomask according to claim 1, wherein the first convex lens and the photomask body are integrated, and the optic axis of the first convex lens is perpendicular to the first surface;
   the concave lens and the photomask body are integrated, and the optic axis of the concave lens is perpendicular to the second surface.

3. The photomask according to claim 2, wherein the photomask body comprises a first body portion and a second body portion split from each other, the first surface is on the first body portion and the first convex lens is integrated with the first body portion, and the optic axis of the first convex lens is perpendicular to the first surface;
   the second surface is on the second body portion, the concave lens is integrated with the second body portion, and the optic axis of the concave lens is perpendicular to the second surface.

4. The photomask according to claim 1, wherein the photomask body is formed of light transmissible materials, and regions of the photomask body other than the first light-transmissive region are provided with a light shielding layer.

5. The photomask according to claim 4, wherein the photomask body is formed of quartz or glass, and the light shielding layer is formed of chromium oxide.

6. The photomask according to claim 1, wherein a first light shielding layer is on regions of the first surface of the photomask body other than the first light-transmissive subregion, and a second light shielding layer is on regions of the second surface of the photomask body other than the second light-transmissive subregion.

7. The photomask according to claim 1, further comprising:
   a second light-transmissive region penetrating through the first surface and the second surface, wherein the second light-transmissive region comprises a third light-transmissive subregion in the first surface and a fourth light-transmissive subregion in the second surface, the third light-transmissive subregion and the fourth light-transmissive subregion is opposite to each other and have a same area, so that a third collimated light beam incident from the one side of the photomask body at which the first surface is located has a same width as that of a four collimated light beam emergent from the other side of the photomask body at which the second surface is located.

8. The photomask according to claim 7, wherein a third light shielding layer is on regions of the first surface of the photomask body other than the first light-transmissive subregion and the third light-transmissive subregion, and a fourth light shielding layer is on regions of the second surface of the photomask body other than the second light-transmissive subregion and the fourth light-transmissive subregion.

9. An exposure method, comprising:
   performing exposure by using the photomask according to claim 1.

* * * * *

UNITED STATES PATENT AND TRADEMARK OFFICE
CERTIFICATE OF CORRECTION

PATENT NO. : 10,969,676 B2  
APPLICATION NO. : 16/106181  
DATED : April 6, 2021  
INVENTOR(S) : Chengyong He et al.

Page 1 of 1

It is certified that error appears in the above-identified patent and that said Letters Patent is hereby corrected as shown below:

On the Title Page

Delete:
"(73) Assignees: BOE TECHNOLOGY GROUP CO., LTD., Beijing (CN); CHONGQING BOE OPTOELECTRONICS TECHNOLOGY CO.. LTD., Chongqing (CN)"

And Insert:
--(73) Assignees: BOE TECHNOLOGY GROUP CO., LTD., Beijing (CN); CHONGQING BOE OPTOELECTRONICS TECHNOLOGY CO., LTD., Chongqing (CN)--.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*